United States Patent
Lin et al.

(10) Patent No.: US 8,030,574 B2
(45) Date of Patent: Oct. 4, 2011

(54) FLEXIBLE PRINTED CIRCUIT

(75) Inventors: Wen-Bin Lin, Shenzhen (CN); Chih-Hung Chang, Miao-Li (TW)

(73) Assignees: Innocom Technology (Shenzhen) Co., Ltd., Shenzhen, Guangdong Province (CN); Chimei Innolux Corporation, Miao-Li County (TW)

( * ) Notice: Subject to any disclaimer, the term of this patent is extended or adjusted under 35 U.S.C. 154(b) by 765 days.

(21) Appl. No.: 12/150,265

(22) Filed: Apr. 25, 2008

(65) Prior Publication Data
US 2008/0277145 A1 Nov. 13, 2008

(30) Foreign Application Priority Data

Apr. 25, 2007 (CN) .......................... 2007 1 0074217

(51) Int. Cl.
*H05K 1/00* (2006.01)
(52) U.S. Cl. ...................................... 174/254; 174/262
(58) Field of Classification Search .................. 174/254, 174/260–262, 117 FF; 29/825; 156/182
See application file for complete search history.

(56) References Cited

U.S. PATENT DOCUMENTS

| | | | |
|---|---|---|---|
| 5,906,504 A | 5/1999 | Igarashi et al. | |
| 6,270,354 B2 * | 8/2001 | Li et al. | 439/55 |
| 7,231,711 B2 * | 6/2007 | Hwang et al. | 29/825 |
| 2005/0241954 A1 | 11/2005 | Iwanami | |

FOREIGN PATENT DOCUMENTS

| | | |
|---|---|---|
| CN | 1694600 A | 11/2005 |
| TW | M259439 Y | 3/2005 |

* cited by examiner

*Primary Examiner* — Yuriy Semenenko
(74) *Attorney, Agent, or Firm* — Altis Law Group, Inc.

(57) ABSTRACT

A flexible printed circuit includes a flexible substrate, a plurality of first conductive wires, and a plurality of second conductive wires. The flexible substrate includes a first surface and a second surface facing the first surface. The first conductive wires are provided on the first surface. The first conductive wires extend from an edge of the flexible substrate to another edge of the flexible substrate. The second conductive wires are provided on the second surface. The second conductive wires extend from an end of the flexible substrate to a predetermined portion of the flexible substrate. A part of each second conductive wire at the predetermined portion of the flexible substrate is electrically connected with the first conductive wire via a conductive structure.

19 Claims, 6 Drawing Sheets

FLEXIBLE PRINTED CIRCUIT

FIELD OF THE INVENTION

The present invention relates to a flexible printed circuit with conductive structures in a flexible substrate thereof.

GENERAL BACKGROUND

A liquid crystal display has the advantages of portability, low power consumption, and low radiation, and has been widely used in various portable information products such as notebooks, personal digital assistants (PDAs), video cameras and the like. A liquid crystal display usually needs a flexible printed circuit board to connect a variety of electronic circuits together.

Referring to FIG. 9, a conventional flexible printed circuit 900 is shown. The flexible printed circuit 900 includes a flexible substrate 910 including an upper surface 911 and a lower surface 912, a first metallic wire layer 920, a second metallic wire layer 930 and an insulating layer 940. The first metallic wire layer 920 is disposed on the upper surface 911 of the flexible substrate 910. The second metallic wire layer 930 is disposed on the lower surface 912 of the flexible substrate 910. The insulating layer 940 is disposed on the first metallic wire layer 920.

Referring also to FIG. 10, the first metallic wire layer 920 includes a plurality of first conductive metallic wires 921 substantially parallel to each other. The first conductive metallic wires 921 extend from one edge of the flexible substrate 910 to an opposite edge of the flexible substrate 910, and are covered by the insulation layer 940. Each first conductive metallic wire 921 is completely separate from the others. And two ends of each first conductive metallic wire 921 are exposed for disposing soldering materials such as tin or tin-gold alloy thereon, so as to form a first gold finger 922 and a second gold finger 923, respectively.

Referring also to FIG. 11, the second conductive metallic wire layer 930 includes a plurality of second conductive metallic wires (not labeled) substantially parallel to each other. The second conductive metallic wires are completely separate from the others. The second conductive metallic wires locate on an edge of the flexible substrate 910. The second conductive metallic wires are exposed for disposing soldering materials such as tin or tin-gold alloy thereon, so as to form a plurality of third gold fingers 935. Each of the third gold fingers 935 is opposite to a respective gold finger 922 of the first conductive metallic wire 921.

Referring to FIG. 12, at a portion of each first gold finger 922 and corresponding third gold finger 935, a soldering hole 999 is defined through the first gold finger 922, the flexible substrate 910 and the third gold finger 935. A metal layer is disposed on an inner surface of the soldering hole 999 to electrically connect the first gold finger 922 and the third gold fingers 935. The first gold fingers 922 are usually soldered to a first print circuit board (not shown) via a manual soldering process. In detail, the first gold fingers 922 contact the first printed circuit board, and a soldering iron (not shown) contacts the third gold fingers 935. The soldering materials of the first gold fingers 922 and the third gold fingers 935 are melted via heat provided by the solder iron. Then the first gold fingers 922 are soldered to the first printed circuit board along with the solidification of the soldering materials. Superfluous soldering materials flux and fill in the soldering hole 999, making the soldering more reliable. Usually, the second gold fingers 923 are electrically connected with a second printed circuit board (not shown) through an anisotropic conductive film. Thereby, electrical signals from the first printed circuit board can be applied to the second printed circuit board via the first conductive metallic wires 921.

However, in the manual soldering process or a following assembly process, a part of the first conductive metallic wires 921 connecting the first gold fingers 922 are prone to be broken off. Thus an electrical connection of the flexible printed circuit 900 is prone to be damaged, and the flexible printed circuit 900 has a low reliability.

What is needed, therefore, is a flexible printed circuit that can overcome the above-described deficiencies.

SUMMARY

In one aspect, a flexible printed circuit includes a flexible substrate, a plurality of first conductive wires and a plurality of second conductive wires. The flexible substrate includes a first surface and a second surface opposite to the first surface. The first conductive wires are provided on the first surface. The first conductive wires extend from an edge of the flexible substrate to another edge of the flexible substrate. The second conductive wires are provided on the second surface. The second conductive wires extend from an end of the flexible substrate to a predetermined portion of the flexible substrate. A part of each second conductive wire at the predetermined portion of the flexible substrate is electrically connected with the first conductive wire via a conductive structure.

In another aspect, a flexible printed circuit includes a flexible substrate, a plurality of parallel first conductive wires, and a plurality of parallel second conductive wires. The flexible substrate includes a first surface and a second surface opposite to the first surface. The plurality of parallel first conductive wires are disposed on the first surface. The plurality of parallel second conductive wires are disposed on the second surface, and two ends of each second conductive wire are electrically connected to the first conductive wires by conductive structures.

Other novel and advantages features will become more apparent from the following detailed description when taken in conjunction with the accompanying drawings.

DETAILED DESCRIPTION OF PREFERRED EMBODIMENTS

Reference will now be made to the drawings to describe preferred and exemplary embodiments in detail.

Figure 1:
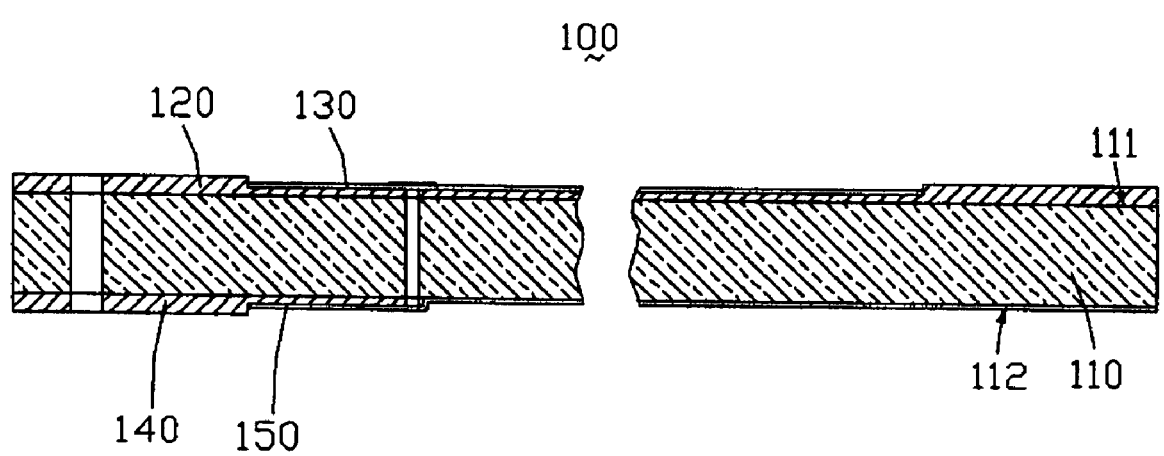
FIG. 1 is a side, cross-sectional view of a flexible printed circuit according to a first embodiment of the present invention.

Referring to FIG. 1, this is a flexible printed circuit 100 of a first embodiment of the present invention. The flexible printed circuit 100 includes a flexible substrate 110 having an upper surface 111 and a lower surface 112, a first metallic wire layer 120, a first insulating layer 130, a second metallic wire layer 140, and a second insulating layer 150. The flexible substrate 110 can be made from any suitable material, including polyester, polyimide, and derivative of the same. The first metallic wire layer 120 is disposed on the upper surface 111 of the flexible substrate 110. The first insulating layer 130 is disposed on the first metallic wire layer 120. The second metallic wire layer 140 is disposed on the lower surface 112 of the flexible substrate 110. The second insulating layer 150 is disposed on the second metallic wire layer 140. The first insulating layer 130 and the second insulating layer 150 can be made from any suitable material, including polyester, polyimide, and derivative of the same.

Figure 2:
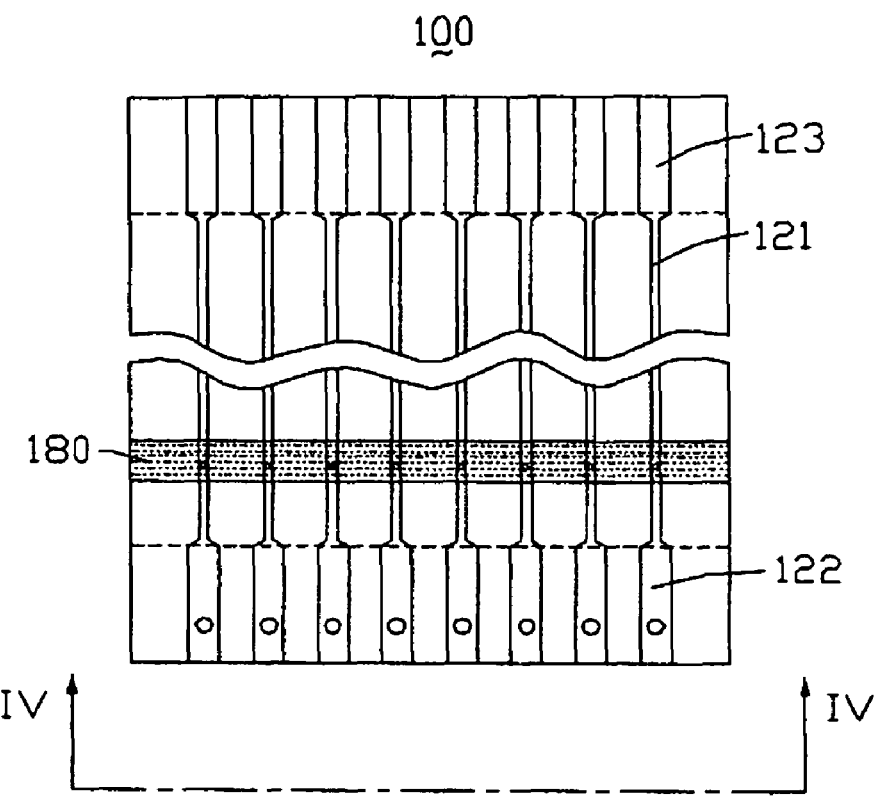
FIG. 2 is a top, plan view of the flexible printed circuit of FIG. 1.

Referring also to FIG. 2, the first metallic layer 120 includes a plurality of first conductive metallic wires 121 substantially parallel to each other. Each first conductive metallic wire 121 is completely separate from the others. Each first conductive metallic wire 121 is covered by the first insulating layer 130. Two ends of each first conductive metallic wires 121 are exposed, and are configured for disposing soldering materials such as tin or tin-gold alloy, so as to form a first gold finger 122 and a second gold finger 123, respectively.

Figure 3:
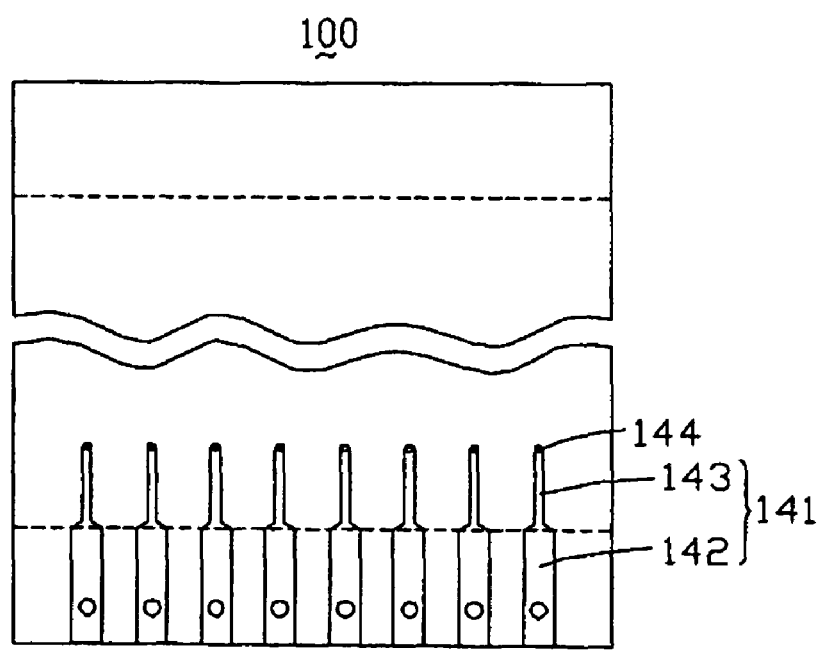
FIG. 3 is bottom, plan view of the flexible printed circuit of FIG. 1.

Referring also to FIG. 3, the second metallic layer 140 includes a plurality of second conductive metallic wires 141 substantially parallel to each other and completely separate from each other. The second conductive metallic wires 141 extend from an edge of the flexible substrate 110 to a predetermined part of the flexible substrate 110. Each of the second conductive metallic wires 141 is opposite to a respective first conductive metallic wires 121.

Ends of the second conductive metallic wires 141 at the edge of the flexible substrate 110 are exposed, and are configured for disposing soldering materials, such as tin or tin-gold alloy, thereby forming a plurality of third gold fingers 142. Each of the third gold fingers 142 corresponds to one of the first gold fingers 122. A portion of each second conductive metallic wire 141 excluding the third gold finger 142 is defined as an extending portion 143. At an end of each extending portion 143, a conductive hole 144 through the corresponding first conductive metallic wire 121, the corresponding second conductive metallic wire 141 and the flexible substrate 110 is defined. A first metal layer is disposed on an inner surface of the conductive hole 144 to electrically connect the first conductive metallic wire 121 and the second conductive metallic wires 141. The first metal layer can be made of a selected one of copper and aluminum. The conductive holes 144 are aligned in a beeline. Moreover, a tape 180 is adhered to a region of the flexible printed circuit 100 where the conductive holes 144 locate (as shown in FIG. 2), so as to prevent the first conductive metallic wires 121 and the second conductive metallic wires 141 from being broken off. The tape 180 can be made from a selected one of acrylic copolymers and epoxy resin.

Figure 4:
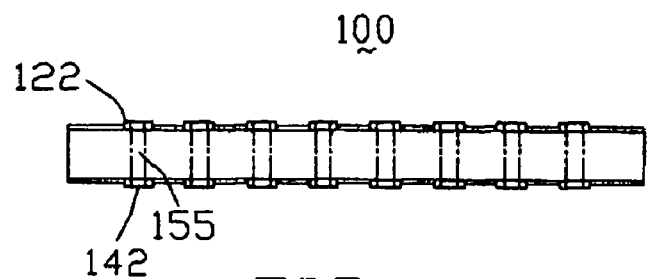
FIG. 4 is a side view of the flexible printed circuit taken along line IV-IV of FIG. 2.

Referring also to FIG. 4, at an end of each first gold finger 122, a soldering hole 155 through the first gold finger 122, the third gold finger 142 and the flexible substrate 110 is defined. A second metal layer (not shown) is deposited on an inner surface of the soldering hole 155 to electrically connect the first gold finger 122 with the third gold finger 142. The second metal layer can also be made of a selected one of copper and aluminum. The first gold fingers 122 can be soldered to a first external printed circuit board (not shown) via a manual soldering method. The second gold fingers 142 can be electrically connected to a second external printed circuit board (not shown) via an anisotropic conductive film.

In operation, electrical signals from the first printed circuit board can transmit through the first gold fingers 122, the middle part of the first conductive metallic wires 121, the second gold fingers 123, the anisotropic conductive film, and reach the second printed circuit board. Meanwhile, the electrical signals can also transmit via the first gold fingers 122, the metal layers in the soldering holes 155, the third gold fingers 142, the extending portion 143 of the second conductive metallic wires 141, the metal layers in the conductive holes 155, the first conductive metallic wires 121, the second gold fingers 123, the anisotropic conductive film, and reach the second printed circuit board.

Compared with the conventional flexible printed circuit, the second metallic wires 141 of the flexible printed circuit 100 extend from one edge of the flexible substrate 110 to the predetermined part of the flexible substrate 110, and each second metallic wire 141 is electrically connected with the opposite first metallic wire 121 by a soldering hole 155 and a conductive hole 144 at two ends, respectively. Thereby, two signal transmitting channels are provided for each pair of first and second metallic wires 121, 141. With this configuration, if the first metallic wire 121 is broken off and an electrical connection between the first gold finger 122 and the second gold finger 123 is cut off, the second metallic wire 141 is still available. That is, the electrical connection between the first gold finger 121 and the second gold finger 123 is stable. Thus, electrical signals can be transmitted from the first gold finger 122 to the second gold finger 123, and the flexible printed circuit is more reliable.

Figure 5:
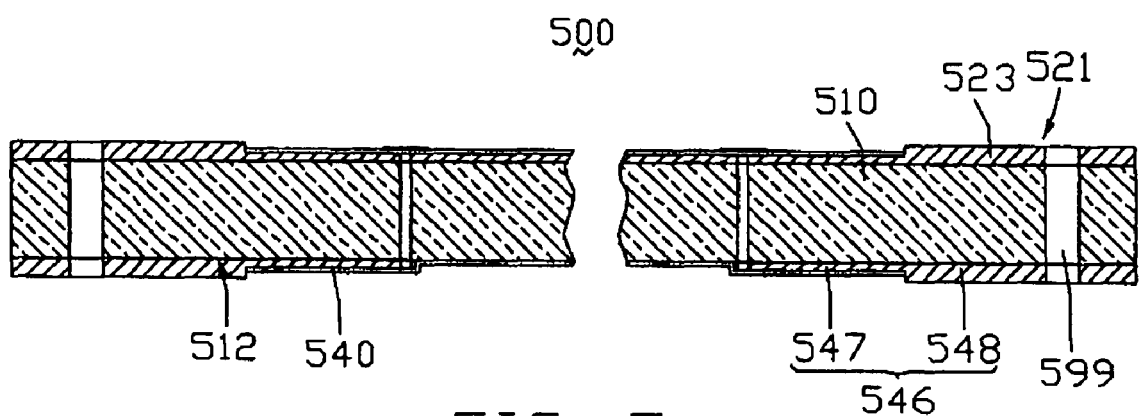
FIG. 5 is side, cross-sectional view of a flexible printed circuit according to a second embodiment of the present invention.
Figure 6:
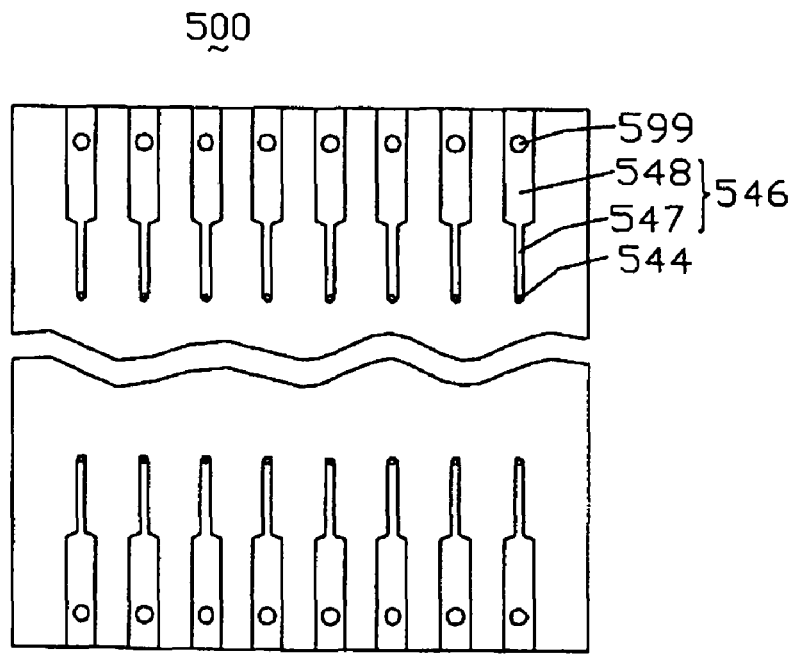
FIG. 6 is bottom, plan view of the flexible printed circuit of FIG. 5.

Referring to FIGS. 5-6, a flexible printed circuit 500 according to a second embodiment of the present invention is shown. The flexible printed circuit 500 is similar to the flexible printed circuit 100 of the first embodiment of the present invention. However, a second conductive metallic layer 540 of the flexible printed circuit 500 includes a plurality of third conductive metallic wires 546. The third conductive metallic wires 546 extend from an edge of a lower surface 512 of a flexible substrate 510 to a predetermined portion of the lower surface 512 of the flexible substrate 510. The third conductive metallic wires 546 are opposite to a plurality of first conductive metallic wires 521, respectively. Ends of the third conductive metallic wires 546 are exposed, and are disposed with soldering materials such as tin or tin-gold alloy, thereby forming a plurality of fourth gold fingers 548. At an end of each fourth gold finger 548, a soldering hole 599 is defined. An inner surface of the soldering hole 599 is disposed with metal layer to electrically connect a second gold finger 523 and the fourth gold finger 548.

An the end of each third conductive metallic wire 546 on the middle portion of the flexible substrate 510 is defined as an extending portion 547. At each extending portion 547, a conductive hole 544 through the second gold finger 523, the flexible substrate 510 and the fourth gold finger 548 is defined. Inner surface of each conductive hole 544 is disposed with metal layer to electrically connect the first conductive metallic wire 521 and the third conductive metallic wire 546.

Figure 7:
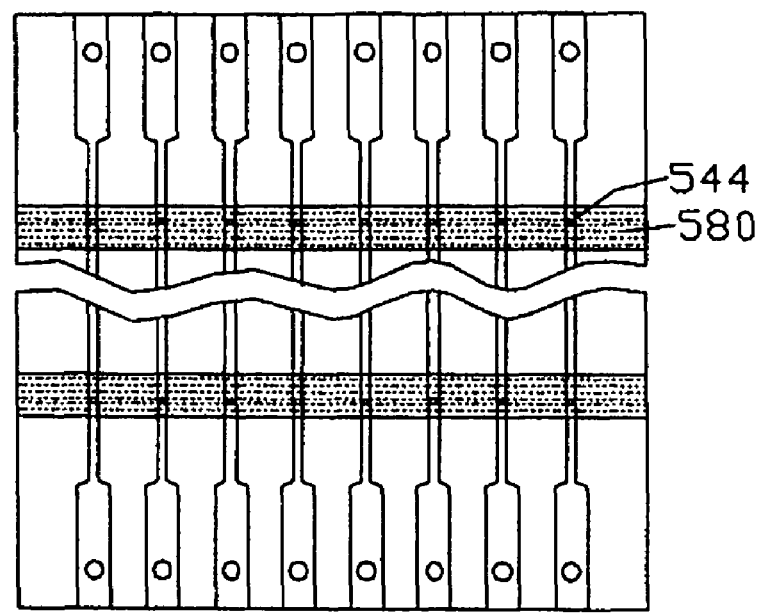
FIG. 7 is a top, plan view of the flexible printed circuit of FIG. 5.

Referring also to FIG. 7, another tape 580 covers a region of the flexible printed circuit 500 where the conductive holes 544 of the third conductive metallic wires 546 locate. Thus, the flexible printed circuit 500 is also reliable and has advantages as the flexible printed circuit 100 according to the first embodiment of the present invention.

Figure 8:
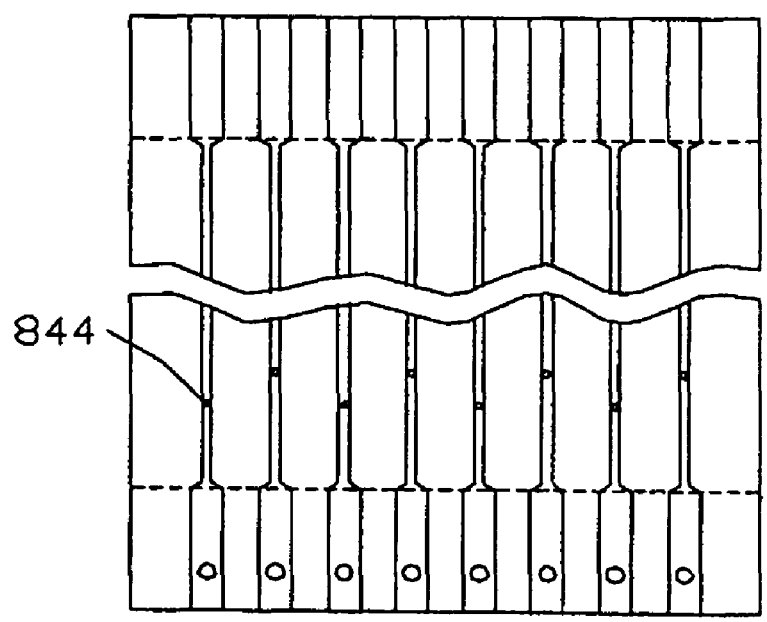
FIG. 8 is a top, plan view of a flexible printed circuit according to a third embodiment of the present invention.
Figure 9:
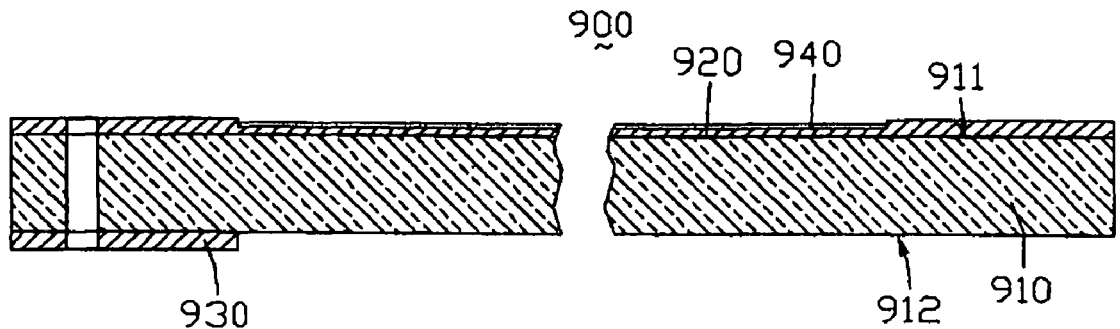
FIG. 9 is a side, cross-sectional view of a conventional flexible printed circuit.
Figure 10:
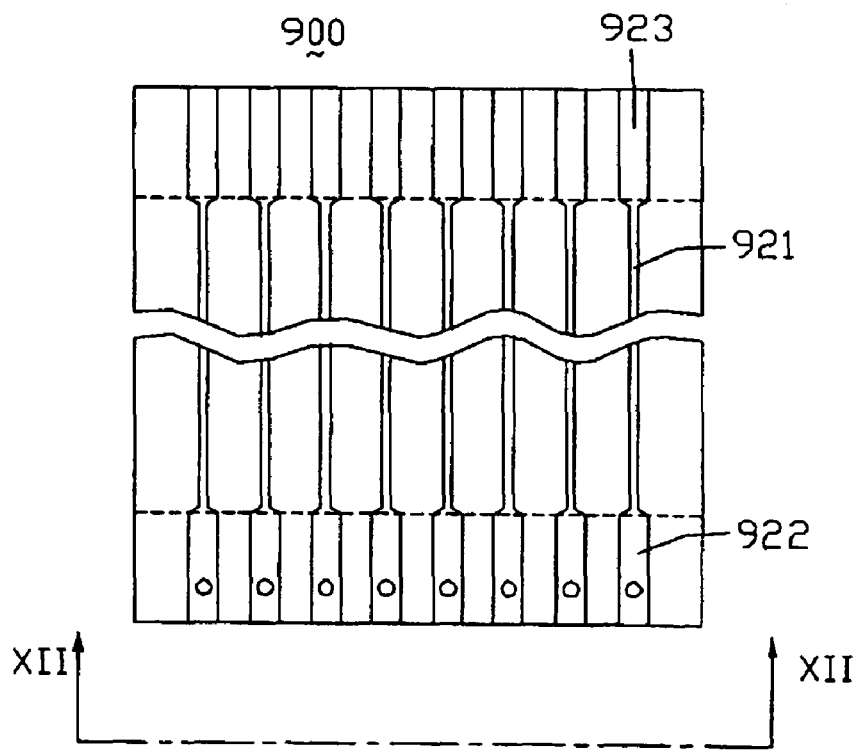
FIG. 10 is a top, plan view of the flexible printed circuit of FIG. 9.
Figure 11:
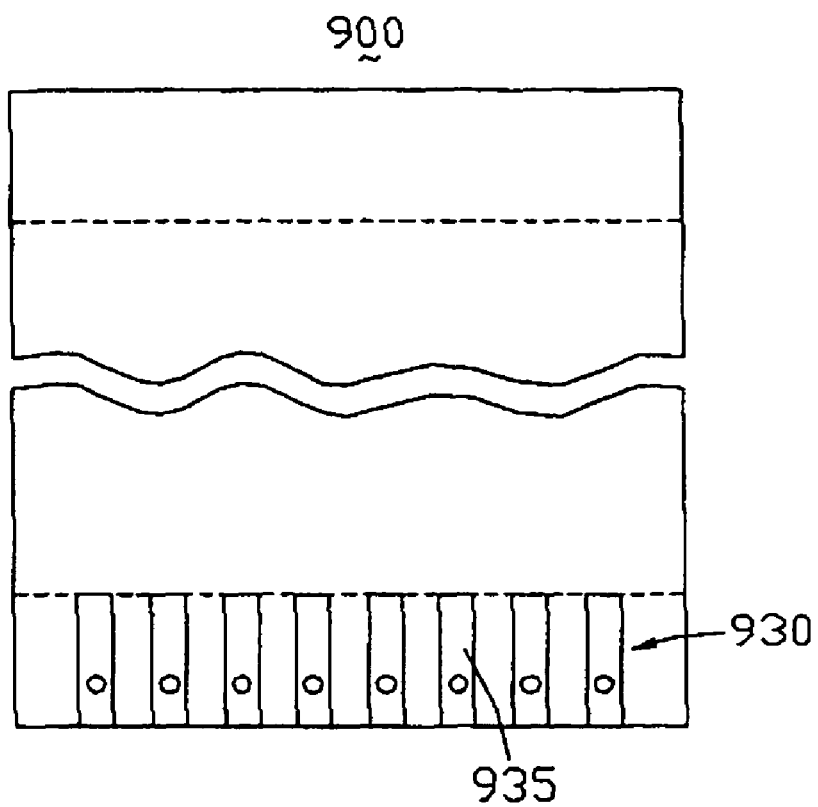
FIG. 11 is a bottom, plan view of the flexible printed circuit of FIG. 9.
Figure 12:
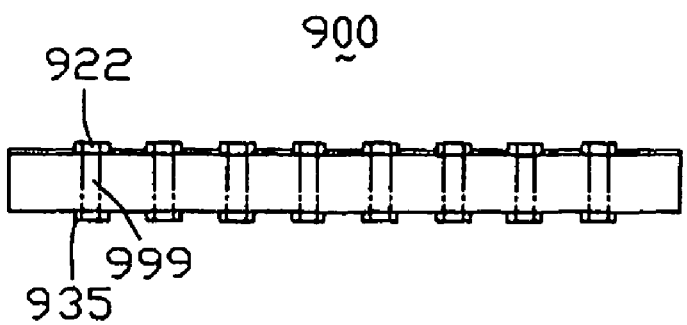
FIG. 12 is a side of the flexible printed circuit of FIG. 10 taken along line XII-XII.

Referring to FIG. 8, a flexible printed circuit according 800 to a third embodiment of the present invention is shown. The flexible printed circuit 800 is similar to the flexible printed circuit 100 of the first embodiment. However, a plurality of conductive holes 844 in the flexible printed circuit 800 are aligned in a curve line. With this configuration, a tape that might otherwise be needed to cover the region where the conductive holes 844 locate can be removed, such that the cost of the flexible printed circuit 800 is reduced.

Furthermore, in an alternative embodiment, the conductive holes can be replaced by other conductive structures such as conductive wires penetrate through the flexible substrate to electrically connect two opposite conductive metallic wires.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A flexible printed circuit comprising:
    a flexible substrate comprising a first main surface and a second main surface on opposite sides thereof;
    a plurality of first conductive wires provided on the first main surface, the first conductive wires extending from an edge of the flexible substrate to another edge of the flexible substrate; and
    a plurality of second conductive wires provided on the second main surface, the second conductive wires extending from said edge of the flexible substrate to a predetermined portion of the flexible substrate;
    wherein a first part of each of the plurality of second conductive wires at said edge of the flexible substrate is electrically connected with a respective one of the plurality of the first conductive wires via a respective one of a plurality of soldering holes;
    a second part of said each of the plurality of second conductive wires at the predetermined portion of the flexible substrate is electrically connected with said respective one of the plurality of first conductive wires via a respective one of a plurality of conductive structures associated with the flexible substrate; and
    a length of said each of the plurality of second conductive wires between said respective one of the plurality of soldering holes and said respective one of the plurality of conductive structures, a length of said respective one of the plurality of first conductive wires between said respective one of the plurality of soldering holes and said respective one of the plurality of conductive structures, said respective one of the plurality of soldering holes and said respective one of the plurality of conductive structures cooperatively form a conductive closed loop.

2. The flexible printed circuit as claimed in claim 1, wherein said respective one of the plurality of conductive structures comprises a conductive hole defined through said respective one of the plurality of first conductive wires, the flexible substrate and the corresponding second conductive wire, with an inner surface of the conductive hole being coated with a metal layer.

3. The flexible printed circuit as claimed in claim 2, wherein the conductive holes of the plurality of conductive structures are arranged in a straight line.

4. The flexible printed circuit as claimed in claim 3, further comprising a tape adhered to a region of the flexible substrate where the conductive holes are located.

5. The flexible printed circuit as claimed in claim 2, wherein the conductive holes are arranged in a curved line.

6. The flexible printed circuit as claimed in claim 1, wherein the conductive structure is a conductive wire extending through the flexible substrate and connected with the first conductive wire and the second conductive wire.

7. The flexible printed circuit as claimed in claim 1, further comprising two insulating layers covering the plurality of first conductive wires and the plurality of second conductive wires, respectively.

8. The flexible printed circuit as claimed in claim 7, wherein parts of the plurality of first conductive wires at the edges of the flexible substrate are exposed, and the exposed parts of the plurality of first conductive wires have soldering material.

9. The flexible printed circuit as claimed in claim 1, wherein an inner surface of each of the plurality of soldering holes is coated with a metal layer.

10. The flexible printed circuit as claimed in claim 1, further comprising a plurality of third conductive wires on the second surface, the plurality of third conductive wires extending from said another edge of the flexible substrate different from the edge where the second conductive wires are to another predetermined portion of the flexible substrate.

11. The flexible printed circuit as claimed in claim 10, wherein an end of each of the plurality of third conductive wires at the another predetermined portion of the flexible substrate is electrically connected with a respective one of the plurality of first conductive wires via a respective one of a plurality of other conductive structures associated with the flexible substrate.

12. The flexible printed circuit as claimed in claim 11, wherein said respective one of the plurality of other conductive structures comprises a conductive hole defined through said respective one of the plurality of first conductive wires, the flexible substrate and the corresponding third conductive wire, with an inner surface of the conductive hole being coated with a metal layer.

13. The flexible printed circuit as claimed in claim 12, wherein the conductive holes of the plurality of other conductive structures are arranged in a straight line.

14. The flexible printed circuit as claimed in claim 13, further comprising a tape adhered to a region of the flexible substrate where the conductive holes of the plurality of other conductive structures are located.

15. The flexible printed circuit as claimed in claim 10, wherein parts of the plurality of third conductive wires at said another edge of the flexible substrate different from the edge where the plurality of second conductive wires are have soldering material.

16. The flexible printed circuit as claimed in claim 10, wherein a part of each of the plurality of third conductive wires at said another edge of the flexible substrate different from the edge where the plurality of second conductive wires are is electrically connected with a respective one of the plurality of first conductive wires via a respective one of a plurality of other soldering holes, said respective one of the plurality of other soldering holes is defined through said each of the plurality of third conductive wires, the flexible substrate and said respective one of the plurality of first conductive wires, with an inner surface of said respective one of the plurality of other soldering holes coated with a metal layer.

17. A flexible printed circuit comprising:
 a flexible substrate comprising a first surface and a second surface at opposite sides thereof;
 a plurality of parallel first conductive wires on the first surface; and
 a plurality of parallel second conductive wires on the second surface, two ends of each of the plurality of parallel second conductive wires being respectively electrically connected with two parts of a respective one of the plurality of parallel first conductive wires by two respective conductive structures of a plurality of conductive structures associated with the flexible substrates;
 wherein said each of the plurality of parallel second conductive wires, a length of said respective one of the plurality of parallel first conductive wires between the two respective conductive structures and the two respective conductive structures cooperatively form a conductive closed loop.

18. The flexible printed circuit as claimed in claim 17, wherein each of the two conductive structures comprises a conductive hole defined through said respective one of the plurality of parallel first conductive wires, the flexible substrate and the corresponding second conductive wire.

19. The flexible printed circuit as claimed in claim 18, wherein an inner surface of the conductive hole is coated with a metal layer.

* * * * *